United States Patent [19]

Iwanczyk et al.

[11] Patent Number: 5,311,044
[45] Date of Patent: May 10, 1994

[54] AVALANCHE PHOTOMULTIPLIER TUBE

[75] Inventors: Jan S. Iwanczyk, Los Angeles; Thomas T. Lewis, Beverley Hills; R. Michael Madden, Newbury Park, all of Calif.

[73] Assignee: Advanced Photonix, Inc., Camarillo, Calif.

[21] Appl. No.: 893,992

[22] Filed: Jun. 2, 1992

[51] Int. Cl.$^5$ .................. H01L 27/14; H01L 31/00
[52] U.S. Cl. ...................... 257/186; 257/434; 257/438; 257/461
[58] Field of Search ............ 257/429, 431, 433, 434, 257/438, 10, 461, 186; 313/354, 366, 373; 315/3

[56] References Cited

U.S. PATENT DOCUMENTS

| | | | |
|---|---|---|---|
| 3,889,143 | 6/1975 | Gowers | 257/433 |
| 5,021,854 | 6/1991 | Huth | 257/438 |
| 5,057,892 | 10/1991 | Iwanczyk | 257/461 |
| 5,138,147 | 8/1992 | van Aller et al. | 257/429 |
| 5,146,296 | 9/1992 | Huth | 257/429 |

*Primary Examiner*—Rolf Hille
*Assistant Examiner*—Minhloan Tran
*Attorney, Agent, or Firm*—Herbert M. Shapiro

[57] ABSTRACT

A small, rugged photomultiplier tube is achieved by closely spacing a large area avalanche "photodetector" with respect to a photocathode in an opaque casing having a window for incident light. The photocathode and the avalanche photodetector have comparable areas and are closely spaced. The avalanche photodetector includes a PN junction which as to be close to the surface of the detector to maximize the response to electrons and reduce any direct response to light. The need for an electrostatic lens to focus electrons onto the small target characteristic of prior art photomultiplier tubes is obviated.

17 Claims, 1 Drawing Sheet

AVALANCHE PHOTOMULTIPLIER TUBE

FIELD OF THE INVENTION

This invention relates to photomultiplier tubes.

BACKGROUND OF THE INVENTION

Photomultiplier tubes are well known in the art. Such a tube includes a housing with a window through which light is admitted. A photocathode is combined with the tube window to provide an incident surface operative to convert incident photons to electrons. The electrons enter an electric field which moves the electrons to a target responsive to the electrons to generate a pulse.

Although a variety of targets have been used in photomultiplier tubes, gain has been limited to 10 with a single stage tube. Moreover, all targets have been quite small compared to the area of the photocathode. Thus, the distance between the target and the photocathode has been necessarily been large and an electric field has been necessary to focus the electrons on the target. The result has been that photomultiplier tubes are larger and heavier.

The photocathode for a photomultiplier tube comprises a transparent substrate such as glass, with a film of a material such as cesium, potassium, aluminum or antimony or various mixtures, thereof as is well understood in the art. The film has to be uniform to permit faithful transfer of an incident image. The film is produced by evaporation from, for example, antimony leads.

There are two common methods for producing the film. The first is called the "transfer" method where the tube, absent the photocathode is maintained in a vacuum with the glass substrate positioned beside the tube in the vacuum. Antimony beads are heated to cause the film to form and the completed photocathode is cemented in place over the target without breaking the vacuum.

The Second method is the "in place" method where the glass substrate is in position within the tube and antimony beads, near the target, are heated to provide the required film. The large separation required in prior art tubes between the photocathode and the target permits the "straight line" evaporation required to produce a uniform film.

BRIEF DESCRIPTION OF AN ILLUSTRATIVE EMBODIMENT OF THIS INVENTION

In accordance with the principle of this invention a large area, light responsive avalanche photodiode is modified to be responsive to electrons rather than to photons and is used as a target in a photomultiplier tube. As a result, the target can be of an area commensurate with that of the photocathode and thus can be positioned in very close proximity to the photocathode. The close spacing is possible because no great separation is required for focusing the electrons onto a small target. Moreover, because the spacing is small, only a small volume needs to be evacuated and the resulting tube is not only small, but is less expensive and exhibit high reliability.

Although, a focusing-field is not necessary in embodiment of this invention where a large area, modified, avalanche "Photo" Diode is used as a target, various other embodiments may use a focusing field to advantage. Such a field is particularly useful where an avalanche diode array is used as the target. An array is used as the target. An array useful to this end when modified to respond to electrons, is disclosed in U.S. Pat. No. 5,012,854 issued Jun. 4, 1991. By focusing the electrons corresponding to positions of an image associated with designated ones of the diodes of any array, an electronic zoom effect can be achieved

DETAILED DESCRIPTION OF AN ILLUSTRATIVE EMBODIMENT OF THIS INVENTION

Figure 1:
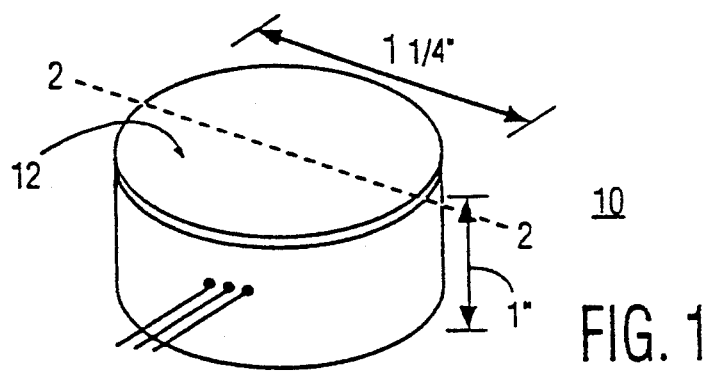
FIG. 1 is a schematic plan view of a photomultiplier tube in accordance with the principle of this invention.

FIG. 1 shows a photomultiplier tube 10 in accordance with the principle of this invention. Illustratively, the tube is round, but could be of other shapes such as square or rectangular. The tube includes an opaque casing 11 having an opening 12 at the top of the tube as viewed in the figure. Opening 12 defines a window through which light enters the casing.

Figure 2:
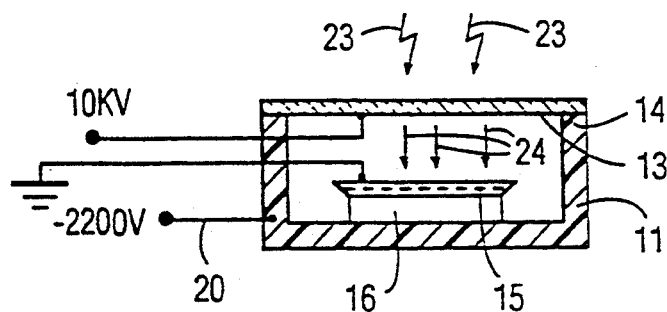
FIG. 2 is a cross section of the tube of FIG. 1 taken along line 2—2.

Photocathode 13 is positioned astride the window as shown in FIG. 2. The photocathode is composed of a glass substrate with a film evaporated onto its underside. The film comprises antimony, cesium (to lower the work function) aluminum, calcium material which is conventional. The photocathode extends across the opening and is cemented to the casing in conventional manner using an indium seal as indicated at 14.

An avalanche photodetector 15 is placed in close proximity to the photocathode as shown in FIG. 2. Photodetector 15 may be mounted on a support 16 or cemented onto the casing 15 depending on the depth of the casing and the prescribed distance between photocathode 13 and avalanche photodetector 15.

Electrical contacts are made to photocathode 13, avalanche photodetector 15 and the casing by wire 18, 19 and 20 respectively. In operation, illustratively a ten kilovolt field is impressed between lines 18 and 19 and a 2200 volt (reverse bias) field is maintained between lines 19 (the anode) and 20.

A suitable avalanche photodetector is described in U.S. Pat. No. 5,057,892 issued Oct. 15, 1991 to Jan Iwanczyk. That photodetector is a wide area photo detector having a surface are corresponding to opening 12. The photodetection is positioned five millimeters from photocathode 13. Photocathode 13 is responsive to incident light through opening 12 to generate electrons. Incident light is indicated by crooked arrows 23 and the electrons are represented by arrows 24. The ten kilovolt field, maintained between photocathode 13 and avalanche photodetector 15, results in the acceleration of the electrons. A reverse bias of 22,000 volts across the avalanche photodetector biases the photodetector to the verge of breakdown. The accelerated electrons cause break-down. Gains of $3 \times 10$ have been achieved experimentally. Thus, 3.6 electron volts, one electron hole pair is created at the surface of avalanche photodetector 15. Thus 3.6 kilovolts generates 1000 pairs. The avalanche photodetector times 1000 yields $3 \times 10$ the gain realized in practice. Actually, there is some loss in practical systems and thus a six kilovolts field is impressed between photocathode 13 and avalanche photodetector 13 in practice to achieve 3×10 gain.

A vacuum is maintained between photocathode 13 and avalanche photodetector 15. The vacuum is provided in a manner well understood in the art and in commercial use with photomultipler tube currently on the market. Consequently, the vacuum and its provision are not discussed further herein. Suffice it to say that the vacuum is provided in a volume which is small compared to the volume in which it is maintained in prior art devices and thus large life times for devices in accordance with the principles of this invention ar expected.

Devices of the type shown in FIGS. 1 and 2 are quite small when compared to prior art photomultiplier tubes. Moreover, they are relatively simple to manufacture and thus are expected to be much less expensive in production than prior art photomultipler tubes. The use of a wide area avalanche photodetector closely spaced from the photodiode obviates the need for an electrostatic lens to focus the electrons onto a small target and obviates the need for a large spacing between the photodiode and the conventional target. This too reduces cost and size and increase lifetime.

Moreover, the combination of a silicon avalanche detector with a "photocathode" results in an enhancement of a response of the detector. The cathode is responsive to radiation in the ultra violet and infra red range which the detector is unresponsive. The combination thus produces an enhanced gain not possible with prior art photomultipler tubes with a single stage.

Figure 3:
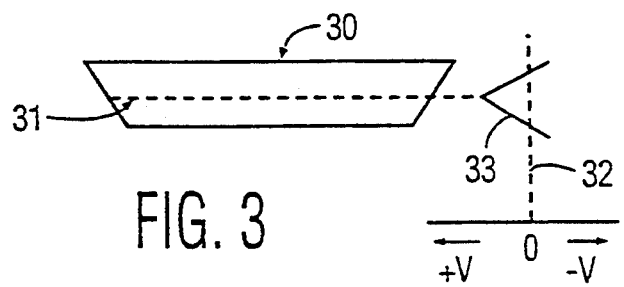
FIG. 3 is a graph of the field profile for the tube of FIGS. 1 and 2.

FIG. 3 shows the electric field profile in the avalanche diode 15 of FIG. 2. The diode is characterized by a PN junction just below surface 30 as shown in FIG. 3. The distance between the PN junction (31) and surface 30 determines the sensitivity of the diode to radiation of different wavelengths, the greater the distance the greater this response. The field is uniform until the junction is encountered as indicated at 31. The field thereafter varies in a manner to accelerate electrons as indicated at 32, The PN junction is very close to the surface (30) to respond only to electrons and so field 31 extends only to a very shallow position of five microns. For optimizing the response to photons, the distance is relatively large, typically thirty five microns. For electrons, the distance is about five microns, a distance for which the photo response is unacceptably poor. The modification of an avalanche photodiode geometry for converting to electrons responsive operation and the close coupling of the resulting diode to a photocathode to achieve a high gain photomultiplier tube is considered a significant departure from prior art thinking.

Moreover, the preplacement of an avalanche diodes in a casing prior to the evaporation of a film for forming a photocathode as described above requires that the diode be made in a manner to withstand the relatively high temperature encountered during outgassing of the device. Processing of avalanche diodes has not been so constrained hitherto and although processing of avalanche diodes to withstand such high temperature is straight forward, the need to process the device in such a manner arises only when the devices are unused in conjunction with photocathodes as described herein.

Figure 4:
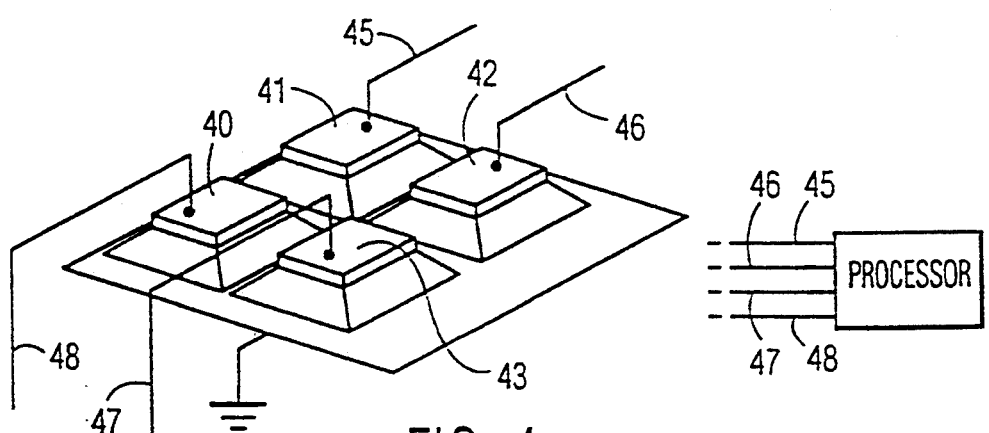
FIG. 4 is a top view of a diode array useful in a photomultiplier tube of the type shown in FIGS. 1 and 2 with an electronic focusing field.

FIG. 4 shows avalanche "photodiode" array of a type which can be modified for use in a photomultiplier tube in accordance with the principle of this invention.

The array includes four diodes 40,41,42 and 43, each operative as an independent detector of the type shown in FIGS. 1 and 2 when modified. The modification, as described above is composed of the placement of the PN junction in each diode of the array relatively close to the electron incident surface of the diode to improve response to electrons and minimize photoresponse. The four diodes of FIG. 4 are formed on the underside of a device as viewed in FIG. 3. Each diode has an electrical connection, 45,46,47, and 48 connected to a (image) processor 50 which may be formed on a wafer in which the diode array is formed. The underside of the array as viewed in FIG. 4 is connected to a reference potential ground.

A photomultiplier tube including a large area avalanche "electrodiode" in accordance with the principle of this invention exhibits a particularly desirable signal to noise ratio. This is clear when it is considered that "signal" is produced by electrons generated in the photocathode film and moved by a large electric field to the avalanche "electrondetector: surface-a high gain region for the tube. Since large gain is realized immediately in the first amplificating stage, a spread in signal is much less than in the conventional PN tube. Excellent signal to noise ratios can be achieved by allowing the counting of single photoelectron events which are well separated from the noise.

What is claimed is:

1. A photomultiplier tube, said tube comprising a casing housing a window for the entry of light into said tube, a photocathode responsive to light for generating electrons, said photocathode having a first surface located at said window, said tube including an avalanche detector responsive to electrons; said detector being positioned in close proximity to said photocathode, said window, said photocathode and said avalanche detector having active surfaces of substantially equal areas, said photocathode and said avalanche detector being positioned in said tube in essentially parallel planes, said photocathode and said avalanche detector forming a space between them, the space between said photocathode and said avalanche detector being evacuated for ensuring the movement of electrons therethrough, said detector including a PN junction parallel to and spaced about 5 microns from said first surface for enhancing the response thereof to electrodes and for reducing the response thereof to light.

2. A tube as set forth in claim 1 wherein said avalanche detector comprises silicon and has a PN junction in close proximity to said first surface for maximizing the response of said detector to electrons.

3. A tube as set forth in claim 2 also including first, second, and third electrical connections to said photocathode, said avalanche detector, and said casing respectively.

4. A tube as set forth in claim 3 wherein said photocathode comprises a compound of antimony with bismuth, aluminum and calcium.

5. A tube as set forth in claim 3 wherein a high position voltage is maintained between said first and second lines and a high negative voltage is maintained between said second and third lines.

6. A tube as set forth in claim 5 wherein said high positive voltage is about six thousand electron volts or more and said high negative voltage is about 2200 volts.

7. A tube as set forth in claim 2 wherein said photocathode comprises a film including antimony.

8. A tube as set forth in claim 7 wherein said detector is processed to withstand temperatures encountered during device outgassing.

9. A radiation responsive device including an opaque casing having a window for admitting light, photocathode means for converting said light to electrons, and avalanche detector means closely spaced from said photocathode means responsive to said electrons for producing an amplified signal, said window, said photocathode means and said avalanche detector means having active surfaces of substantially equal areas, the space between said photocathode means and said avalanche detector means including an electric field and being evacuated for enhancing the movement of electrons to said detector, said photocathode having a first surface located at said window, said detector including a PN junction parallel to and spaced about 5 microns from said first surface for enhancing the response thereof to electrodes and for reducing the response thereof to light.

10. A radiation responsive device as set forth in claim 9 wherein said detector includes a surface exposed to incident electrons and a PN junction spaced with respect to said surface a distance to enhance a response to electrons and minimizing only response to incident photons.

11. An avalanche detector for producing an electrical signal responsive to incident electrons, said detector comprising a body of semiconductor material having first and second parallel major surfaces, said detector including a PN junction parallel to and spaced closely to, said first surface for enhancing the response thereof to electrons and for reducing the response thereof to light, said PN junction being spaced about 5 microns from said first surface.

12. An avalanche detector as set forth in claim 11 including an opaque surface coating.

13. An avalanche detector as set forth in claim 12 further comprising an electrostatic lens focusing onto designated ones of said photodiode electrons corresponding to positions of an image associated therewith.

14. An avalanche detector as set forth in claim 13 wherein said semiconductor material is silicon.

15. An avalanche detector as set forth in claim 11 including a reflective surface coating.

16. An avalanche detector as set forth in claim 11 wherein said body of semiconductor material comprises an avalanche photodiode array, said photodiode array including a p-n junction parallel to said first surface and closely spaced with respect thereto for enhancing the exposure thereof to electrons.

17. An avalanche detector as set forth in claim 16 wherein said avalanche photodiode array is configured to withstand exposure to high temperatures encountered during device outgassing.

* * * * *